(12) United States Patent
Scheible et al.

(10) Patent No.: US 7,214,571 B2
(45) Date of Patent: May 8, 2007

(54) ELECTROMECHANICAL ELECTRON TRANSFER DEVICES

(75) Inventors: Dominik V. Scheible, Munich (DE); Robert H. Blick, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/227,336

(22) Filed: Sep. 15, 2005

(65) Prior Publication Data

US 2006/0011998 A1     Jan. 19, 2006

Related U.S. Application Data

(63) Continuation of application No. 10/833,344, filed on Apr. 27, 2004, now Pat. No. 6,946,693.

(51) Int. Cl.
*H01L 21/339* (2006.01)

(52) U.S. Cl. ............... 438/144; 438/142; 257/213; 257/214; 257/414; 257/416; 257/E21.051

(58) Field of Classification Search ......... 257/213, 257/215, 414, 416, E21.051; 438/142, 144
See application file for complete search history.

(56) References Cited

U.S. PATENT DOCUMENTS

| 6,355,532 B1 * | 3/2002 | Seliskar et al. ............ 438/283 |
| 6,573,526 B1 | 6/2003 | Yamashita et al. |
| 6,653,653 B2 | 11/2003 | Brousseau, III |
| 6,700,693 B2 | 3/2004 | Roberts et al. |
| 6,946,693 B1 * | 9/2005 | Scheible et al. ............ 257/213 |

FOREIGN PATENT DOCUMENTS

DE       19961811 A1       7/2001

OTHER PUBLICATIONS

A. Erbe, et al., "Nanomechanical Resonator Shuttling Single Electrons at Radio Frequencies," Physical Review Letters, vol. 87, No. 9, Aug. 27, 2001, pp. 96106-1-96106-4.

* cited by examiner

*Primary Examiner*—Leonardo Andujar
*Assistant Examiner*—Victor A. Mandala, Jr.
(74) *Attorney, Agent, or Firm*—Foley & Lardner, LLP

(57) ABSTRACT

An electron transfer device is implemented in a structure which is readily capable of achieving charge transfer cycle frequencies in the range of several hundred MHz or more and which can be formed by conventional semiconductor integrated circuit manufacturing processes. The device includes a substrate having a horizontal extent and a pillar on the substrate extending from the substrate vertically with respect to the horizontal extent of the substrate. The pillar is formed to vibrate laterally with respect to the vertical length of the pillar at a resonant frequency which can be several hundred MHz. Drain and source electrodes extend from the substrate vertically with respect to the horizontal extent of the substrate, and have innermost ends on opposite sides of the pillar. The pillar is free to vibrate laterally back and forth between the innermost ends of the drain and source electrodes to transfer charge between the electrodes.

36 Claims, 5 Drawing Sheets

(i) $-\pi/2 < \phi < 0$ (ii) $\phi = -\pi/2$ (iii) $-\pi < \phi < -\pi/2$

ELECTROMECHANICAL ELECTRON TRANSFER DEVICES

CLAIM OF PRIORITY

This application is a continuation of U.S. patent application Ser. No. 10/833,344, now issued as U.S. Pat. No. 6,946,693, filed on Apr. 27, 2004, and issued Sep. 20, 2005.

FIELD OF THE INVENTION

The present invention pertains generally to the field of micro- and nanoelectromechanical systems and to electron transfer devices implemented in such systems.

BACKGROUND OF THE INVENTION

A classical system in which electrical charge can be transferred or shuttled mechanically uses two large capacitor plates and a metalized ball (or particle) suspended between the plates. Charging one of the plates (and grounding the other) will attract the ball to the charged electrode via the Coulomb force and upon contact with the plate the ball will exchange electrons with the plate. The acquired excess charge in the ball will in turn accelerate the ball in the electric field between the plates to the grounded electrode, where the excess electrons are dumped upon contact. Depending on the system geometry (plate and ball size and distance between the plates), applied voltage, and the manner in which the ball is suspended, the ball will cycle back and forth between the plates at a frequency which may reach a few kHz. The result is an effective transfer of charge (i.e., a current flow) between the plates.

The integration of a mechanical degree of freedom in nanostructures utilized in nanoelectromechanical systems (NEMS) opens a potential wide range of applications in, for example, sensors and communication electronics. Mechanical resonators manufactured with nanometer dimensions have been formed to oscillate at radio frequencies up to the range of GHz. See, e.g., R. H. Blick, et al., J. Phys.: Cond. Mat. 14 (2002) R905; X. M. H. Huang, et al., Nature (London) 421 (2003) 496. Significant progress has been made with regard to the control of non-linear dynamics and dissipation of NEMS at radiofrequencies. D. V. Scheible, et al., Appl. Phys. Lett. 81 (2002) 1884; D. V. Scheible, et al., Appl. Phys. Lett. 82 (2003) 3333; F. W. Beil, et al., Phys. Rev. Lett. (2004) (submitted for publication). NEMS also have promise for providing experimental insight into the quantum aspects of mechanical systems.

Efforts have been made to implement a mechanical charge shuttle into NEMS structures by combining a nanomechanical resonator with a single-electron transistor (SET). Such nanomechanical charge shuttles were formed by combining cantilevers with SETs fabricated on the tips of the cantilevers to form a so-called electromechanical SET (or EMSET). A. Erbe, et al., Appl. Phys. Lett. 73 (1998) 3751; A. Erbe, et al., Phys. Rev. Lett. 87 (2001) 096106. These devices were achieved using traditional NEMS fabrication utilizing optical and electron beam lithography of layered silicon substrates incorporating a sacrificial layer. Experiments with these devices showed electron tunneling that was mechanically chopped at radio frequencies. It would be desirable to be able to increase the operating frequency preferably to several hundred MHz and into the GHz range, and to be able to fabricate charge transfer devices utilizing semiconductor processing techniques that are more compatible with standard integrated circuit manufacturing.

SUMMARY OF THE INVENTION

In accordance with the invention, an electron transfer device is implemented in a structure which is readily capable of achieving charge transfer cycle frequencies in the range of several hundred MHz or more. Furthermore, the devices in accordance with the invention can be formed by conventional semiconductor integrated circuit manufacturing processes without utilizing a sacrificial layer during processing. In addition, the devices of the invention can be formed to have a very small footprint or area on the semiconductor chip, allowing for dense packing of an array of such structures. The devices are well suited to be incorporated as circuit elements, such as rectifiers and transistors, as well as in various gas and radiation sensors.

An electron transfer device in accordance with the invention includes a substrate having a horizontal extent and a pillar on the substrate extending from the substrate vertically with respect to the horizontal extent of the substrate. The pillar is formed to vibrate laterally with respect to the vertical length of the pillar and has a fundamental vibration mode with a resonant frequency. The pillar includes an electrical conductor that is electrically insulated from the substrate. Drain and source electrodes extend from the substrate vertically with respect to the horizontal extent of the substrate, with each of the source and drain electrodes having innermost ends which are on opposite sides of the pillar and which are spaced from the pillar. Each of the source and drain electrodes includes an electrical conductor therein that is electrically insulated from the electrical conductor of the pillar and the electrical conductor of the other electrode. The pillar is free to vibrate laterally back and forth between the innermost ends of the drain and source electrodes so as to bring the electrical conductor of the pillar alternately closer to one of the drain and source electrodes and then closer to the other of the drain and source electrodes during each cycle as the pillar vibrates.

The substrate is preferably an insulator, and the pillar and drain and source electrodes are preferably formed on the substrate of a layer of semiconductor and a layer of conductive metal on the layer of semiconductor. For example, the devices may be formed on a semiconductor on insulator (SOI) wafer wherein the substrate is the insulating layer (e.g., silicon dioxide), and the semiconductor is crystalline silicon. The conductor may be a layer of metal, such as gold, or a highly doped semiconductor. The resonant frequency of the device may be selected by appropriate choice of dimensions for the device. Typical dimensions for the pillar include a vertical height in the range of 100 nm to 2,000 nm and horizontal dimensions (cross-sectional width or diameter) in the range of 20 nm to 200 nm. However, other structural materials and other dimensions may also be utilized. For example, using appropriate mounting methods, nanotubes may be used as vertical pillars and can have smaller diameters, e.g., in the range of 5 nm. The innermost ends of the drain and source electrodes are typically spaced from the pillar a distance in the range of 5 nm to 50 nm. The pillar may have a region below the top of the pillar which has reduced horizontal dimensions so as to form a waist in the pillar which can be utilized to select the resonant frequency of the pillar. To provide asymmetry, one of the drain and source electrodes is preferably more closely spaced to the pillar than the other of the electrodes. An AC source may be electrically connected to the source and drain electrodes to provide AC voltage thereto to excite vibration of the pillar. A DC source may also be coupled to one of the drain and source electrodes to provide a DC bias voltage thereto. The AC source provides an AC voltage that is preferably at or near the resonant frequency of the pillar. For example, the vertical and horizontal dimensions of the pillar are readily selected such that the pillar has a fundamental lateral vibration mode with a resonant frequency in the range of 10 MHz to 1 GHz or even greater.

The device of the invention can also include a gate electrode on the substrate that has an innermost end adjacent to and spaced from the pillar at a position between the innermost ends of the drain and source electrodes. The gate electrode preferably extends from the substrate vertically with respect to the horizontal extent of the substrate, and has an electrical conductor therein that is electrically insulated from the conductor of the pillar and the conductors of the drain and source electrodes.

Further objects, features and advantages of the invention will be apparent from the following detailed description when taken in conjunction with the accompanying drawings.

DETAILED DESCRIPTION OF THE INVENTION

Figure 1:
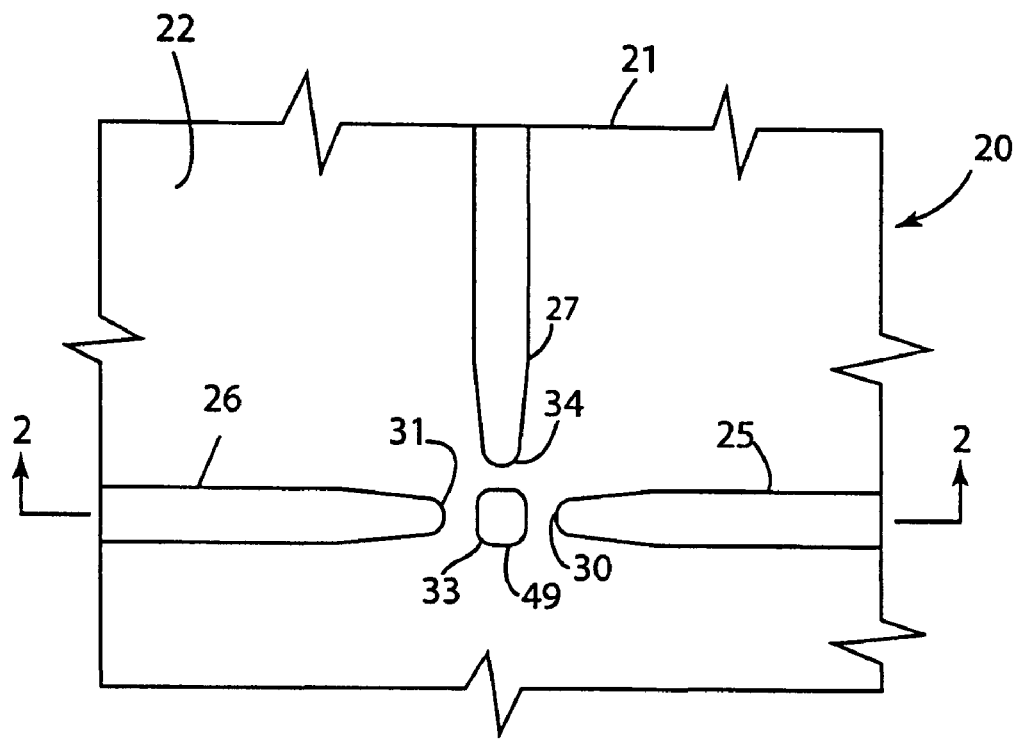
FIG. 1 is a simplified plan view of an electromechanical charge transfer device formed in accordance with the invention.
Figure 2:
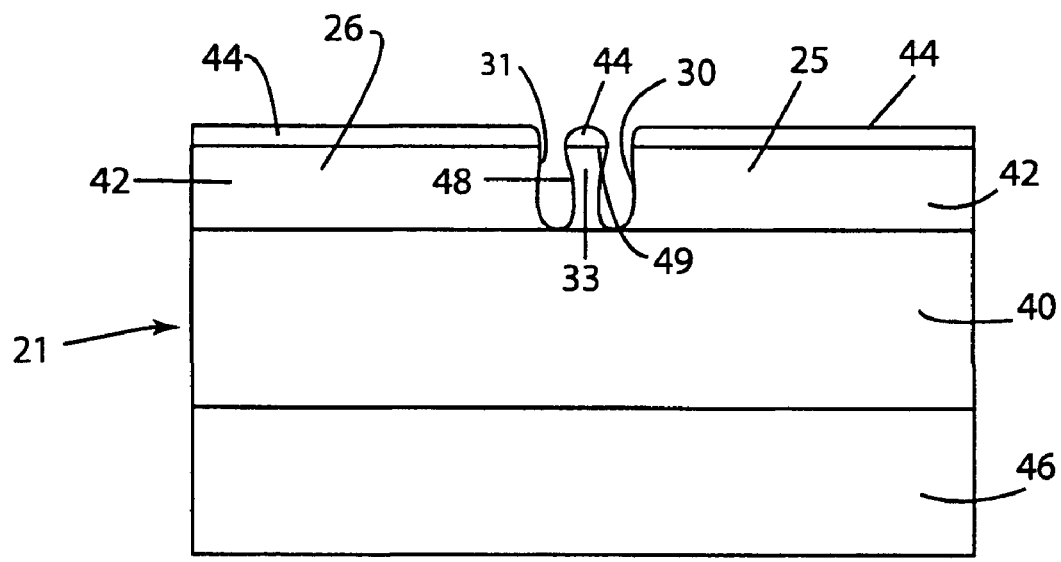
FIG. 2 is a cross-sectional view of the device of FIG. 1 taken generally along the line 2—2 of FIG. 1.

With reference to the drawings, an electromechanical charge transfer device in accordance with the invention is shown generally at 20 in FIG. 1. The device 20 is formed on a substrate 21 such as a silicon on insulator (SOI) wafer which has a top surface 22. The substrate 21 extends in two dimensions of horizontal extent which generally but does not necessarily lie in a flat plane. A source electrode 25, a drain electrode 26, and a gate electrode 27 are formed on the substrate 21 and generally extend vertically with respect to the horizontal extent of the substrate 21 and thus vertically away from the surface 22 of the substrate. The source electrode 25 has an innermost end 30 and the drain electrode 26 has an innermost end 31 which face each other and are spaced from each other across a gap. A vibratable pillar 33 is formed on the substrate 21 and extends vertically therefrom in the gap between the source and drain electrodes so that the innermost ends 30 and 31 of the source and drain electrodes, respectively, are on opposite sides of and are spaced from the pillar 33. The gate electrode 27 also has an innermost end 34 which is spaced from the pillar 33 by a small gap at a position between the innermost ends 30 and 31 of the source and drain electrodes. As illustrated in FIG. 2, the substrate 21 may include an insulating layer 40, and the source electrode 25, drain electrode 26, and pillar 33 may be formed of a layer of crystalline silicon 42 with a top layer or coating of conductor 44 on each element formed of a conductive metal such as gold. The gate electrode 27 may also be formed in the same manner with the same structure. The insulating layer 40 may comprise the intermediate insulating $SiO_2$ layer formed on a handle wafer 46 of crystalline silicon, and with the silicon layer 42 formed from the top crystalline silicon layer of a conventional SOI wafer. However, the invention may be formed of other materials including other semiconductor materials, conductors and insulators. Because the substrate layer 40 is formed of an insulating material (e.g., $SiO_2$, etc.), the source electrode 25, drain electrode 26, gate electrode 27 and pillar 33 are electrically insulated from each other so that current does not flow through the substrate between these structures. However, electrical insulation of these substrates may be provided by insulation in the structures themselves. The invention may be implemented in other material systems that can be micromachined and by other processes. The entire pillar (or electrodes) can be conducting (e.g., heavily doped semiconductor or a metal) or have a conductor layer formed therein, with electrical insulation formed between the pillar and electrodes.

A particular advantage of the present invention is the limited number of processing steps required to form the device, and the compatibility of such processing steps with conventional semiconductor integrated circuit manufacturing. The device of the invention as shown in FIGS. 1 and 2 can be formed in two steps on a standard SOI substrate having an insulating layer 40 with a thin silicon (or other semiconductor) layer 42 formed thereon. In a first step for processing of the SOI wafer, the pattern of the gold layer 44 is defined using, e.g., nano-scale lithography, such as by utilizing e-beam lithography via a scanning electron microscope (SEM). After the patterned gold layers 44 are formed, the wafer is then moved to a reactive ion etcher (RIE) where dry etching is carried out. The etching process attacks the silicon layer 42 that is not covered by the gold layer 44 and mills down the silicon in a direction perpendicular to the chip surface. The lithographically defined gold layer 44 thus acts both as electrical current leads and as an etch mask for the RIE process. In the etching process, the vertical pillar 33 may be formed to have essentially vertical sidewalls or it may have an area of reduced horizontal cross-section to form a waist 48 as shown in FIG. 2. The cross-section of the pillar may have a square or other polygonal shape or may be substantially circular. The dimensions of the pillar 33 are selected to allow the pillar to vibrate mechanically in a lateral mode in which the pillar bends so that the top 49 of the pillar and the conductor 44 move closer to or further away from each of the inner ends 30 and 31 alternately, referred to herein as lateral vibration. The formation of the narrowed waist 48 may be selected to select the resonant frequency of the pillar 33.

Figure 3:
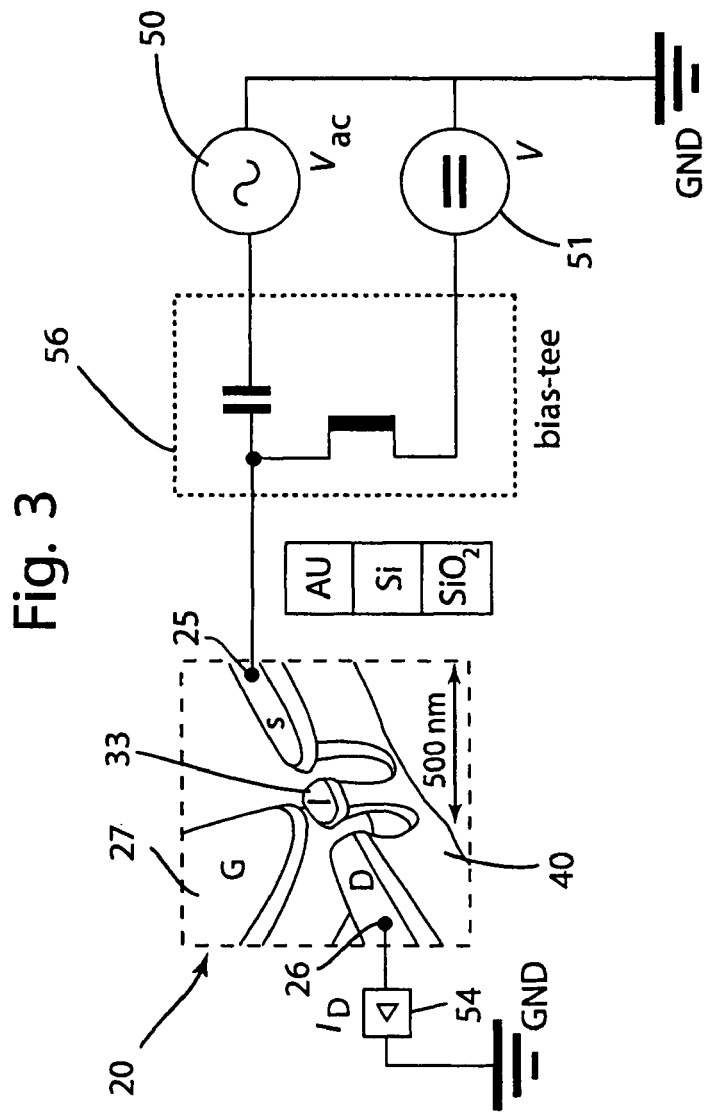
FIG. 3 is a perspective view of the device of the invention with the electrical circuit connections to the device shown schematically.
Figure 4:
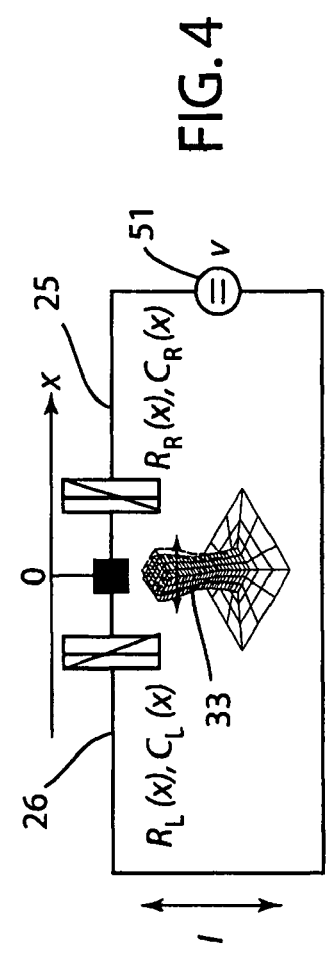
FIG. 4 is a schematic circuit diagram of the device of the invention illustrating the equivalent circuit elements of the device.

The shuttling of electrons by the pillar 33 can be represented conceptually as shown in the circuit diagrams of FIGS. 3 and 4. Charge transfer between pillar and electrode can occur by electron tunneling, field emission, gas ionization, or direct mechanical contact. As known from work on single-electron tunneling, the barriers of the pillar 33 to drain 20 and to source 23 can be represented by a parallel combination of the tunneling resistance R and the junction capacitance C. However, because the barriers are mechanically flexible tunneling barriers, diagonal lines are shown through the R/C boxes in FIG. 4. These two lines are not parallel, relating to the fact that once the source junction is tuned mechanically into the open state, the drain junction will be opaque.

The device of the invention is well suited to operation in the radio-frequency range. In FIG. 3 the fabricated device 20 is shown in perspective with the underlying silicon dioxide insulating base 40 supporting the pillar 33 in the center between the drain electrode 26 and the source electrode 25. The device is controlled by biasing the source 25 and drain 26 and/or the gate 27. The bias voltage applied to the gate electrode 27 will affect the resonant frequency of the vibrating pillar 33, and control of the gate bias voltage can thus be used to control the effective current flow through the device. However, the device of the invention may be utilized without a gate 27 or with multiple gates, if desired. The natural resonant frequency of the pillar 33 depends on the pillar height and lateral (horizontal) dimensions, as well as on the material constants and the metallic top layer mass. For pillar heights (distance from the top 49 of the pillar to the junction of the pillar with the substrate) in the range of 100 nm to 2,000 nm, resonant frequencies of 10 MHz to 1 GHz may be readily obtained. The horizontal dimensions of the pillar are typically in the range of 20 nm to 200 nm, and the innermost ends of the drain and source electrodes are typically spaced from the pillar a distance in the range of 5 nm to 50 nm. Excitation of the resonator is most efficiently provided by an AC source 50 and a DC source 51 biasing through the drain and source electrodes. The resulting drain current flow $I_D$ can be measured, for example, by a current/voltage converter 54.

Of significance for the device 20 when functioning as a switch or signal filter is the fact that its throughput resistance is drastically enhanced since only one contact (drain or source electrode) is open during a half-cycle of operation: once the pillar 33 is biased, a certain number of electrons N will flow onto the pillar (depending on the pillar's electrostatic potential) and jump off the pillar only when the other contact (drain or source electrode) comes into reach during the second half-cycle of the switch revolution.

For excitation of the pillar 33 into lateral vibration, an AC voltage may be applied at the source electrode 25 from the source 51. Application of an AC signal allows one to excite the pillar 33 resonantly in one of its eigenmodes. Gradually accumulating charge on the pillar 33 results in a resonant Coulomb force (RCF) within the AC source-drain electric field. The basic concept underlying the device is the excitation of mechanical oscillation via the excess charge on the pillar. Hitherto employed excitation mechanisms, such as magnetomotive driving, are not suitable for mass-production devices, due to the high magnetic field which is required (typically B~1-10 T). In addition, the present device can be operated without cryogenic cooling and achieves accurate and well reproducible operation in the non-cryogenic temperature range of 77–300 K and higher.

During a cycle of deflection of the pillar 33, the pillar exchanges charge carriers with the biased source electrode 25 and N electrons tunnel off the pillar and M electrons tunnel from the electrode to the pillar. The respective amounts N and M are determined by the instantaneous electrical bias. The detected current $I_D$ is the net number of transferred electrons n (=N−M) times the shuttle frequency f, i.e.:

$$I_D = gef(N-M) = gefn \quad (1)$$

where e is the electric charge and g accounts for a statistical limitation for the case where the pillar deflection is not sufficient for charge transport in each cycle. For the excitation via the resonant Coulomb force it is necessary that the shuttle pillar sustains a certain excess charge during oscillation. This can be obtained by a mechanical asymmetry (e.g., one of the source and drain electrodes is closer to the pillar than the other electrode) which strongly favors one tunneling barrier at which the shuttle pillar is reset to the same charge state each cycle. Assuming m electrons present on the shuttle for the time period when both tunneling barriers are closed, for stable operation the relation (N−M) =n<m must hold. The RCF function $F_{RCF}(t)$ is then calculated via $$F_{RCF}(t) = me \frac{\hat{V}_{AC}\sin(2\pi f t)}{d_{SD}} \quad (2)$$

where $\hat{V}_{AC}$ is the AC voltage amplitude and $d_{SD}$ is the source-drain distance. A finite element simulation was used to obtain an estimate of the source to pillar capacitance of about $C_{SF}=10$ aF (attoFarads). This results in a maximum excess charge m=24 electrons, causing, in turn, a force of 7 pN at an incident AC power of P=+5 dBm. Important for the current frequency behavior is the phase relation of the mechanical motion and the electrical AC bias. In the case of a harmonic oscillator, the driven resonator follows the applied force with a phase lag of $$\phi_h(f) = \arctan\frac{\Gamma f}{f_h^2 - f^2} \quad (3)$$

wherein the resonance frequency is $f_h$. For excitation of a mechanical eigenmode h of the nanopillar 33 the phase lag equals $\phi_h=\pi/2$, i.e., maximum deflection occurs when N=M. For an ideal system, we accordingly expect a zero net current $I_D=0$ for $f=f_h$. Above and below the resonance frequency $f_h$, the phase lag approaches −π and zero respectively. Depending on the sign of the excess charge m, the result is either a positive current for $f>f_h$ and a negative current for lower frequencies or vice versa.

Figure 5:
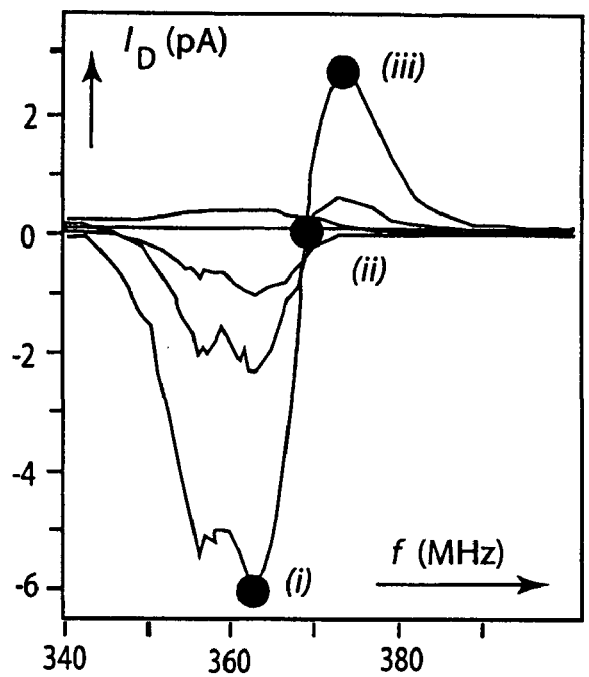
FIG. 5 is a graph of spectral drain current $I_D$ versus source frequency f for an exemplary device formed in accordance with the invention having a resonant frequency of 369 MHz.
Figure 6:
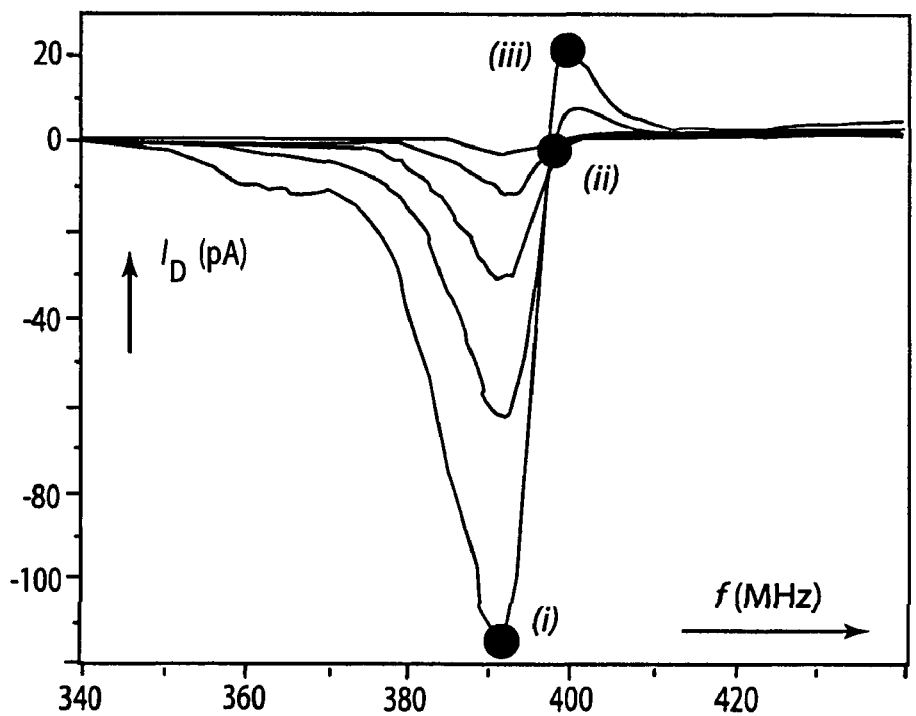
FIG. 6 is a graph of spectral drain current $I_D$ versus source frequency f for another exemplary device in accordance with the invention having a resonant frequency of 399 MHz.

Basic measurements of the current frequency response have been carried out for two example devices showing similar behavior at slightly different eigenfrequencies $f_0$. This variation is explained by the different heights and waistlines of the pillar 33 in the two devices. A finite element simulation showed similar results as the sample devices in absolute resonance frequencies and variations. The current traces $I_D$ for a set of AC powers P are plotted in FIGS. 5 and 6 for the two sample devices. Highest current amplitudes correspond to a transported net amount of electrons n<2, following Eq. (1), which satisfies well the condition n<m. For the two sample devices the negative and positive peak currents differ by factors of 2 and 5, respectively. Mechanical asymmetry and inhomogeneity of the effective electric field destroy the phase relation of an ideal harmonic oscillator, and hence cause the asymmetric peaks seen in FIGS. 5 and 6.

Figure 7:
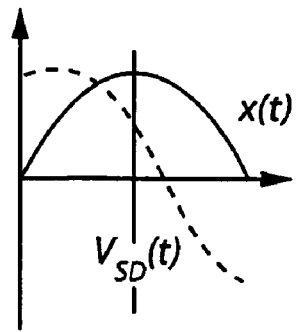
FIG. 7 is a graph of phase relation and source-drain bias for the device of the invention at an oscillation frequency f which is less than the resonant frequency $f_h$.
Figure 8:
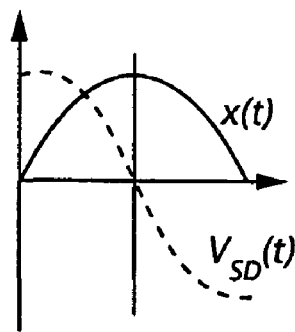
FIG. 8 is a graph of phase relation and source-drain bias for the device of the invention at an oscillation frequency f equal to the resonant frequency $f_h$.
Figure 9:
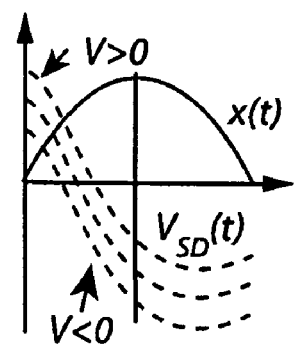
FIG. 9 is a graph of phase relation and source-drain bias for the device of the invention at an oscillation frequency f which is greater than the resonant frequency $f_h$.
Figure 10:
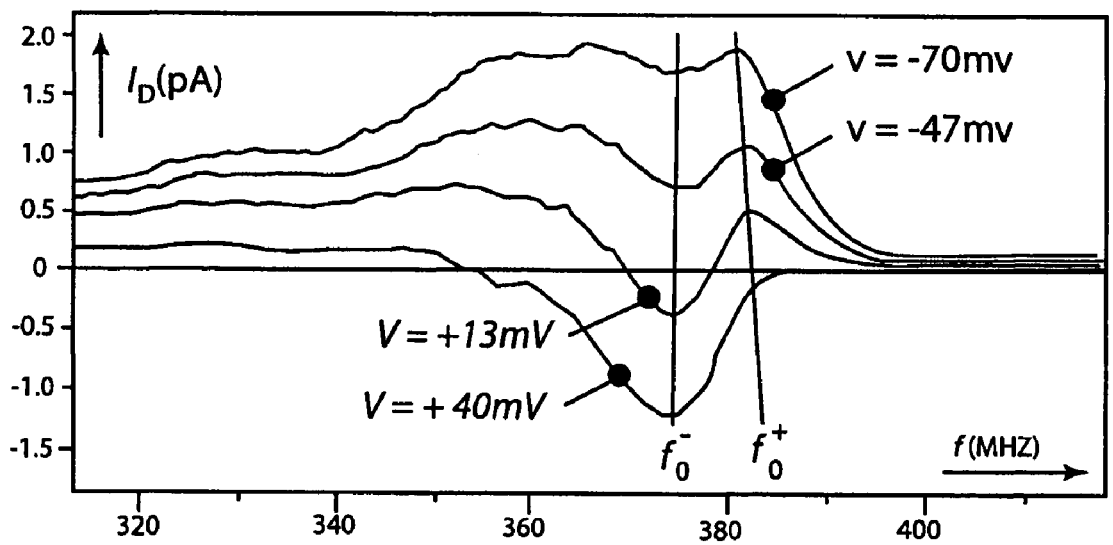
FIG. 10 are graphs illustrating the tuning of the current resonance by a superimposed DC bias V.
Figure 11:
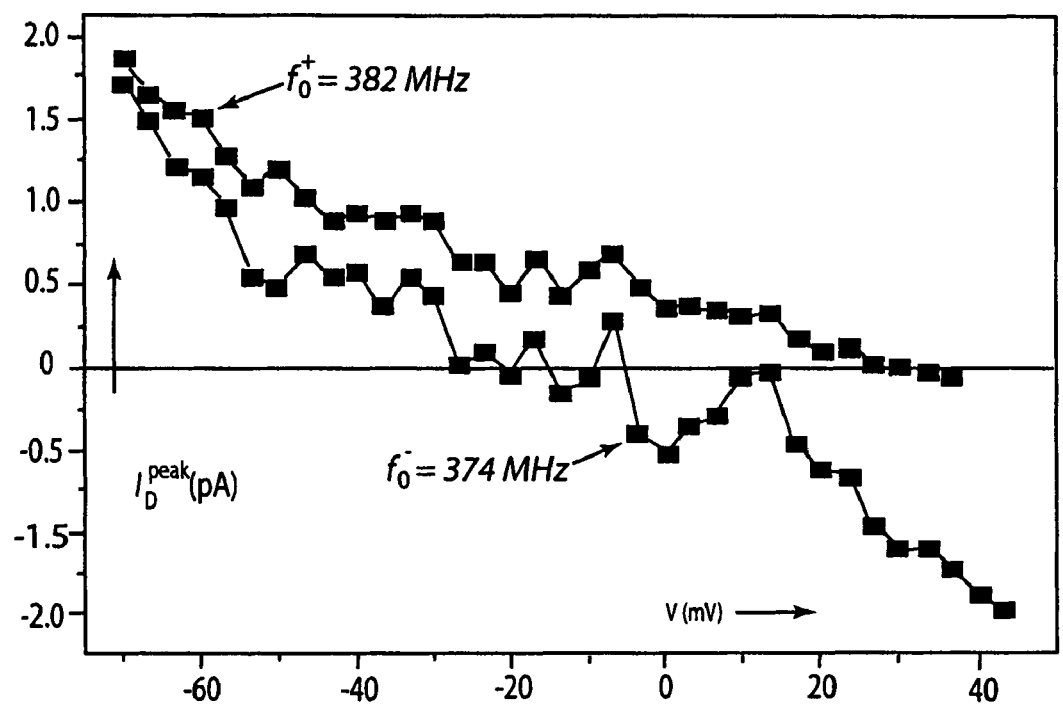
FIG. 11 are graphs of negative (lower trace) and positive (upper trace) peak currents $I_D^{peak}$ versus DC bias V, with the traces representing a section of the whole set of current spectra at frequencies $f_0^-$ about equal to 374 MHz and $f_0^+$ about equal to 382 MHz.

The mechanism of RCF can be verified in the present invention via a superposition of a DC bias voltage V onto the AC voltage $V_{AC}$. This is accomplished by use of an inserted bias-tee 56 as shown in FIG. 3. As long as the DC bias is small compared to the AC voltage amplitude $\hat{V}_{AC}$, the main influence of the DC bias is the phase shift between the deflection point and the effective drain/source bias, as illustrated in FIGS. 7–9. As a result, switching is accomplished between forward and reverse current peaks in FIG. 9, as well as zero current as in FIG. 8. FIG. 10 shows the spectral current for a set of selected DC bias voltages ranging from −70 mV to +40 mV. It is important to note that the observed behavior not only supports RCF, but also demonstrates the tunability of this mechanical device for rectification of high frequency AC signals. A summary of all traces at the lower and upper peak frequencies $f_0^{\pm}$ reveals that the peaks are not only detuned, but also can give a reverse current response. As FIG. 11 shows, this is achieved for a high DC bias exceeding 40 mV. In addition to the detuning, a regular step-like structure is observed in both peaks when the DC bias is ramped. The separation of the steps (~23 mV) corresponds to the pillar-source capacitance; however, the total island capacitance for room temperature operation should only be $e^2/k_B T \approx 3$ aF. Hence, the steps can be attributed to a gradual change of the oscillatory mode rather than Coulomb blockade effects.

It is understood that the invention is not confined to the embodiments set forth herein for illustration, but embraces all forms thereof as come within the scope of the following claims.

What is claimed is:

1. A method of controlling an electron transfer device comprising:
   providing an electron transfer device, the electron transfer device comprising a source electrode, a drain electrode, and a pillar;
   applying a first electric potential to at least one of the source electrode and the drain electrode to excite a vibration of the pillar whereby a first electrical conductor of the pillar moves alternately closer to a second electrical conductor of the source electrode and then to a third electrical conductor of the drain electrode; and
   controlling a current flow between the source electrode and the drain electrode using the applied first electric potential.

2. The method of claim 1 wherein the first electric potential is an AC voltage.

3. The method of claim 2 wherein a frequency of the AC voltage is approximately equal to a resonant frequency of the electron transfer device.

4. The method of claim 1 wherein the first electric potential is a superposition of a DC voltage and an AC voltage.

5. The method of claim 4 wherein the DC voltage is small compared to the AC voltage.

6. The method of claim 1 further comprising applying a second electric potential to a gate electrode to control the current flow through the electron transfer device, wherein the electron transfer device further comprises the gate electrode.

7. The method of claim 6 further comprising controlling a resonant frequency of the electron transfer device using the applied second electric potential.

8. The method of claim 1 wherein the electron transfer device further comprises:
   a substrate having a horizontal extent;
   the pillar extending from the substrate vertically with respect to the horizontal extent of the substrate, the first electrical conductor at an end of the pillar opposite the substrate;
   the drain electrode extending from the substrate vertically with respect to the horizontal extent of the substrate, the drain electrode including a drain innermost end and the second electrical conductor that is electrically insulated from the first electrical conductor and that is at an end of the drain electrode opposite the substrate; and
   the source electrode extending from the substrate vertically with respect to the horizontal extent of the substrate, the source electrode including a source innermost end and the third electrical conductor that is electrically insulated from the first electrical conductor and the second electrical conductor and that is at an end of the source electrode opposite the substrate;
   wherein the drain innermost end and the source innermost end are spaced from the pillar on opposite sides of the pillar, and further wherein the vibration of the pillar comprises lateral movement of the pillar between the drain innermost end and the source innermost end.

9. The method of claim 8 wherein the electron transfer device further comprises a gate electrode extending from the substrate vertically with respect to the horizontal extent of the substrate, the gate electrode including a gate innermost end spaced from the pillar at a position between the drain innermost end and the source innermost end.

10. The method of claim 9 wherein the gate electrode includes a fourth electrical conductor that is electrically insulated from the first electrical conductor, the second electrical conductor, and the third electrical conductor.

11. The method of claim 8 wherein at least one of a vertical height of the pillar and a horizontal dimension of the pillar is selected to affect a resonant frequency of the electron transfer device.

12. The method of claim 11 wherein the resonant frequency is greater than approximately 10 Mhz.

13. The method of claim 12 wherein the resonant frequency is in the range of 10 MHz to 1 GHz.

14. The method of claim 11 wherein the vertical height is in the range of 100 nm to 2,000 nm and the horizontal dimension is in the range of 5 nm to 200 nm.

15. The method of claim 8 wherein the drain innermost end and the source innermost end are spaced from the pillar a distance in the range of 5 nm to 50 nm.

16. The method of claim 8 wherein the first electrical conductor has a first horizontal dimension, and further wherein the pillar comprises a waist, the waist comprising a horizontal cross section of the pillar below the first electrical conductor, the horizontal cross section having a second horizontal dimension, the second horizontal dimension less than the first horizontal dimension.

17. The method of claim 16 wherein the second horizontal dimension is selected to affect a resonant frequency of the electron transfer device.

18. The method of claim 8 wherein one of the drain electrode and the source electrode is more closely spaced to the pillar than the other of the electrodes.

19. The method of claim 1 wherein through the vibration of the pillar a charge transfer occurs from one of the drain electrode and the source electrode to the pillar.

20. The method of claim 19 wherein the charge transfer occurs by a method selected from the group consisting of electron tunneling, field emission, gas ionization, and mechanical contact.

21. A method of fabricating an electron transfer device comprising:
coating a layer of a conducting material on a substrate having an extent in a horizontal plane thereby forming a pattern, wherein the pattern comprises a source electrode that includes a source innermost end, a drain electrode that includes a drain innermost end, and a pillar electrode, wherein the pillar electrode is between the drain innermost end of the drain electrode and the source innermost end of the source electrode, and further wherein the substrate includes an insulating layer and a semiconductor layer; and
etching the substrate to form a pillar extending from the substrate vertically with respect to the horizontal extent of the substrate, thereby forming a gap between the pillar electrode and the drain innermost end of the drain electrode and between the pillar electrode and the source innermost end of the source electrode;
wherein the pillar electrode has a first horizontal dimension, and further wherein the pillar comprises a waist, the waist comprising a horizontal cross section of the pillar below the pillar electrode, the horizontal cross section having a second horizontal dimension, the second horizontal dimension less than the first horizontal dimension.

22. A circuit element comprising:
a circuit element comprising an electron transfer device, the electron transfer device comprising
a substrate having a horizontal extent;
a pillar extending from the substrate vertically with respect to the horizontal extent of the substrate, a first electrical conductor at an end of the pillar opposite the substrate;
a drain electrode extending from the substrate vertically with respect to the horizontal extent of the substrate, the drain electrode including a drain innermost end and a second electrical conductor that is electrically insulated from the first electrical conductor and that is at an end of the drain electrode opposite the substrate; and
a source electrode extending from the substrate vertically with respect to the horizontal extent of the substrate, the source electrode including a source innermost end and a third electrical conductor that is electrically insulated from the first electrical conductor and the second electrical conductor and that is at an end of the source electrode opposite the substrate;
wherein the drain innermost end and the source innermost end are spaced from the pillar on opposite sides of the pillar, and further wherein the pillar can move laterally between the drain innermost end and the source innermost end.

23. The circuit element of claim 22 wherein the first electrical conductor has a first horizontal dimension, and further wherein the pillar comprises a waist, the waist comprising a horizontal cross section of the pillar below the first electrical conductor, the horizontal cross section having a second horizontal dimension, the second horizontal dimension less than the first horizontal dimension.

24. The circuit element of claim 22 wherein the circuit element is selected from the group consisting of a rectifier, a transistor, a switch, and a filter.

25. An electronic device comprising:
an electronic device, the electronic device comprising a circuit element, the circuit element comprising an electron transfer device, the electron transfer device comprising
a substrate having a horizontal extent;
a pillar extending from the substrate vertically with respect to the horizontal extent of the substrate, a first electrical conductor at an end of the pillar opposite the substrate;
a drain electrode extending from the substrate vertically with respect to the horizontal extent of the substrate, the drain electrode including a drain innermost end and a second electrical conductor that is electrically insulated from the first electrical conductor and that is at an end of the drain electrode opposite the substrate; and
a source electrode extending from the substrate vertically with respect to the horizontal extent of the substrate, the source electrode including a source innermost end and a third electrical conductor that is electrically insulated from the first electrical conductor and the second electrical conductor and that is at an end of the source electrode opposite the substrate;
wherein the drain innermost end and the source innermost end are spaced from the pillar on opposite sides of the pillar, and further wherein the pillar can move laterally between the drain innermost end and the source innermost end.

26. The electronic device of claim 25 wherein the electronic device is selected from the group consisting of a sensor, a transmitter, and a receiver.

27. An electron transfer device comprising:
a substrate having a horizontal extent;
a pillar extending from the substrate vertically with respect to the horizontal extent of the substrate, a first electrical conductor at an end of the pillar opposite the substrate;
a drain electrode extending from the substrate vertically with respect to the horizontal extent of the substrate, the drain electrode including a drain innermost end and a second electrical conductor that is electrically insulated from the first electrical conductor and that is at an end of the drain electrode opposite the substrate; and
a source electrode extending from the substrate vertically with respect to the horizontal extent of the substrate, the source electrode including a source innermost end and a third electrical conductor that is electrically insulated from the first electrical conductor and the second electrical conductor and that is at an end of the source electrode opposite the substrate;
wherein the drain innermost end and the source innermost end are spaced from the pillar on opposite sides of the pillar, and further wherein the pillar can move laterally between the drain innermost end and the source innermost end.

28. The electron transfer device of claim 27 further comprising an AC source coupled to at least one of the drain electrode and the source electrode to provide an AC voltage thereto thereby exciting the lateral movement of the pillar, wherein a frequency of the AC voltage is approximately equal to a resonant frequency of the electron transfer device.

29. The electron transfer device of claim 28 further comprising a DC source coupled to at least one of the drain electrode and the source electrode to provide a DC voltage thereto thereby exciting the lateral movement of the pillar.

30. The electron transfer device of claim 28 wherein at least one of a vertical dimension of the pillar and a horizontal dimension of the pillar is selected to affect the resonant frequency of the electron transfer device.

31. The electron transfer device of claim 30 wherein the resonant frequency is greater than approximately 10 MHz.

32. The electron transfer device of claim 27 wherein the electron transfer device further comprises a gate electrode extending from the substrate vertically with respect to the horizontal extent of the substrate, the gate electrode including a gate innermost end spaced from the pillar at a position between the drain innermost end and the source innermost end, the gate electrode further including a fourth electrical conductor that is electrically insulated from the first electrical conductor, the second electrical conductor, and the third electrical conductor.

33. The electron transfer device of claim 32 further comprising a bias voltage source coupled to the gate electrode to provide a bias voltage thereto, the bias voltage selected to control a current flow through the electron transfer device.

34. The electron transfer device of claim 32 further comprising a bias voltage source coupled to the gate electrode to provide a bias voltage thereto, the bias voltage selected to control a resonant frequency of the electron transfer device.

35. The electron transfer device of claim 28 wherein through the lateral movement of the pillar a charge transfer occurs from one of the drain electrode and the source electrode to the pillar.

36. The electron transfer device of claim 35 wherein the charge transfer occurs by a method selected from the group consisting of electron tunneling, field emission, gas ionization, and mechanical contact.

* * * * *